United States Patent [19]

Hachiya

[11] Patent Number: 6,144,932
[45] Date of Patent: Nov. 7, 2000

[54] SIMULATION DEVICE AND ITS METHOD FOR SIMULATING OPERATION OF LARGE-SCALE ELECTRONIC CIRCUIT BY PARALLEL PROCESSING

[75] Inventor: Koutarou Hachiya, Tokyo, Japan

[73] Assignee: NEC Corporation, Tokyo, Japan

[21] Appl. No.: 09/089,163

[22] Filed: Jun. 2, 1998

[30] Foreign Application Priority Data

Jun. 2, 1997 [JP] Japan ................................. 9-143955

[51] Int. Cl.[7] ......................................... G06F 17/50
[52] U.S. Cl. .............................. 703/14; 703/15; 703/16; 708/446
[58] Field of Search ..................... 395/500.34, 500.35, 395/500.36, 500.37, 500.23; 708/446; 703/13, 14, 15, 16, 2

[56] References Cited

U.S. PATENT DOCUMENTS

| | | | |
|---|---|---|---|
| 5,313,398 | 5/1994 | Rohrer et al. .................... | 395/500.35 |
| 5,369,594 | 11/1994 | Huange et al. ................... | 395/500.35 |
| 5,442,569 | 8/1995 | Osano .............................. | 395/500.21 |
| 5,490,278 | 2/1996 | Mochizuki ........................ | 708/446 |
| 5,754,181 | 5/1998 | Amdursky et al. ............... | 345/419 |
| 5,768,160 | 6/1998 | Kakegawa ........................ | 395/500.37 |

OTHER PUBLICATIONS

Eickhoff et al., "Levelized Incomplete LU Factorization and its Application to Large–Scale Circuit Simulation", IEEE Transactions on Computer–Aided Design of Integrated Circuits and Systems, vol. 14, Issue 6, pp. 720–727, Jun. 1995.

Mayaram et al., "A Parallel Block–Diagonal Preconditioned Conjugate–Gradient Solution Algorithm for Circuit and Device Simulationts", Digest of Technical Papers from the 1990 IEEE International Conference on Computer–Aided Design, pp. 446–449, Nov. 1990.

Wu et al., "Performance Tuning of a Multiprocessor Sparse Matrix Equation Solver", Proceedings of the Twenty–Eighth Hawaii International Conference on System Sciences, vol. II, pp. 4–13, Jan. 1995.

Simic et al., "Partitioning Strategies within a Distributed Multilevel Logic Simulaotr including Dynamic Repartitioning", Proceedings of the European Design Automation Conference, pp. 96–101, Sep. 1993.

Burch et al., "A new Matrix Solution Technique for General Circuit Simulation", IEEE Transactions on Computer–Aided Design of Integrated Circuits and Systems, vol. 12, Issue 2, pp. 225–241, Feb. 1993.

Mayaram et al., "A Parallel Block–Diagonal Preconditioned Conjugate–Gradient Solution Algorithm for Circuit And Device Simulations", pp. 446–449, (1990).

Mayaram et al., "A Parallel Block–Diagonal Preconditioned Conjugate–Gradient Solution Algorithm for Circuit And Device Simulations", pp. 446–449, (1990).

*Primary Examiner*—Eric W. Stamber
*Assistant Examiner*—Douglas W. Sergent
*Attorney, Agent, or Firm*—Foley & Lardner

[57] ABSTRACT

A simulation device comprises an equation generating unit for generating a simultaneous linear equation by application of the implicit integration formula and the Newton iteration method to the description data of an electronic circuit to be simulated, a plurality of block ILU factorization units for performing incomplete LU factorization processing in parallel on each block in a coefficient matrix of the generated simultaneous linear equation, a plurality of fill-in adding units for adding a plurality of fills-in generated by the incomplete LU factorization to a combined portion of coefficient matrices, in parallel, a plurality of line collection ILU factorization units for ILU-factorizing each of several line collections on the combined portion where the fills-in are added, and a convergent solution judging unit for repeating a series of the above processing until convergence of a solution in the simultaneous linear equation generated by the equation generating unit is reached.

8 Claims, 13 Drawing Sheets

× ---- NON-ZERO ELEMENT EXISTING BEFORE INCOMPLETE LU FACTORIZATION

⊗ ----- FILL-IN ELEMENT AT LEVEL 1

⦿ ----- FILL-IN ELEMENT AT LEVEL 2

SIMULATION DEVICE AND ITS METHOD FOR SIMULATING OPERATION OF LARGE-SCALE ELECTRONIC CIRCUIT BY PARALLEL PROCESSING

BACKGROUNDS OF THE INVENTION

1. Field of the Invention

The present invention relates to a simulation device and its method for simulating an operation of an LSI (Large Scale Integrated Circuit) or the other large-scale electronic circuit by processing data in parallel with a plurality of data processing means.

2. Description of the Related Art

A simulation of an electronic circuit with a computer computes and supplies time series change in each potential of several joints and each current value of several elements on the electronic circuit. When executing the simulation, an ordinary differential equation indicating the operation of the electronic circuit is time-discretized, and a simultaneous non-linear equation is obtained by the application of the implicit integration formula to it. The Newton iteration method is applied to the obtained simultaneous non-linear equation, and the resultant solution of a simultaneous linear equation is repeated so to obtain a solution at each discrete time point.

When performing a simulation of a large-scale electronic circuit having more than ten thousands of elements like an LSI, the time required for solving the above simultaneous linear equation occupies more than half the entire calculation time, and is increased with increasing scale of an electronic circuit. A method of solving a simultaneous linear equation includes a direct method and an iteration method. The direct method is not practical because the time required for solving a simultaneous linear equation becomes extremely long as the size of the circuit is increased, and therefore, the iteration method is generally adopted for a simulation of a large-scale electronic circuit.

The iteration method means the way in which an approximation sequence of a solution $\{x(0), x(1), x(2), \ldots\}$ is sequentially solved, so as to arrive at a solution $x(i)$ at full convergence. As the conventional iteration method for use in this kind of simulation, there are, for example, BiCG method (Bi Conjugate Gradient Method), QMR method (Quasi-Minimal Residual Method), CGS method (Conjugate Gradient Squared Method), and Bi-CGSTAB method (Bi-CG Stabilized Method). When actually executing this kind of iteration method, generally performed is the preprocessing for changing a simultaneous equation into a form of getting easy convergence. Without preprocessing, operation will not converge on a solution in some cases, and therefore, preprocessing is practically indispensable.

As preprocessing, an incomplete LU factorization (Lower/Upper factorization) (hereinafter, referred to as ILU factorization) is used in many cases. In the ILU factorization, approximate value of the LU factorization is solved by completely ignoring fills-in generated by the LU factorization, or by allowing the fills-in to be propagated to a constant level. A fill-in means an element that is "0" in the matrix before the LU factorization and no longer "0" after the LU factorization. The processing for allowing the propagation of such fill-in to a constant level L is expressed as ILU(L) and the processing thereof is to be executed like the flow chart of FIG. 12.

When executing the ILU factorization-preprocessed iteration method as mentioned above by use of a parallel processor, a circuit is partitioned at first, thereby to get a bordered-block-diagonal matrix as a coefficient matrix, as illustrated in FIG. 13. The ILU factorization on this coefficient matrix is executed in parallel in every block of A1, A2, ..., An, respectively by a plurality of processors, and thereafter, the ILU factorization on the combined portion D is sequentially executed.

A method for solving the problem caused by the ILU factorization on the combined portion D being a sequential execution, is disclosed in the introduction "A Parallel Block-Diagonal Preconditioned Conjugate-Gradient Solution Algorithm for Circuit and Device Simulations" of "International Conference on Computer Aided Design 90". The same article discloses a method of performing the ILU factorization on the whole blocks and combined portion in parallel by ignoring the non-diagonal blocks B1 to Bn, and C1 to Cn in the bordered portion.

According to the above-mentioned various methods, an operation of an electronic circuit can be simulated by parallel processing of a plurality of data processing means. However, according to the first method of the conventional technique, in which the ILU factorization on the combined portion is subject to a sequential execution at the end, it is difficult to shorten the whole processing time. This is why, although it may be possible to shorten the processing time by increasing the number of processors for parallel processing of the ILU factorization in every block and decreasing the volume of each processing, the number of the ILU factorization sequentially executed on the combined portion at the end is increased, thereby increasing the processing time of the combined portion sequentially executed. For example, the conventional simulation disclosed in the above article, if using four processors, improves the speed about 2.2 times faster than the case of using one processor.

The second method of the conventional technique, in which the ILU factorization on the whole blocks and combined portion is performed in parallel by ignoring non-diagonal blocks of the bordered portion in the parallel processing of the ILU factorization, increases the iteration times for a solution of a linear equation to some times by the influence of the ignored portion, thereby preventing from shortening the whole processing time. This is why, although in the ILU factorization, the iteration times becomes less according as the result is closer to a complete LU factorization, ignorance of non-diagonal blocks in the bordered portion results in an increase in the difference between the ILU factorization and the complete LU factorization.

Further, in the second method of the conventional technique, since the error of the numerical operation such as roundoff error is increased if the iteration times is increased, a linear equation may not converge on a solution in the actual calculation however it may be an iteration method capable of converging theoretically.

SUMMARY OF THE INVENTION

An object of the present invention is to provide a simulation device and its method capable of shortening the processing time effectively by increasing the number of parallel processing, in order to solve the above problems.

According to the first aspect of the invention, a simulation device for simulating an operation of an electronic circuit, comprises a data input means for receiving description data of an electronic circuit to be simulated, a data partitioning means for partitioning the description data of the electronic circuit received from the data input means so to generate each description data of partial circuits, a point deciding means for deciding a time point of the next stage for the description data of the partial circuit generated by the data partitioning means, an equation generating means for generating a simultaneous linear equation by application of the implicit integration formula and the Newton iteration method to the description data of the partial circuit where a time point of the next stage has been decided by the point deciding means, a plurality of block ILU factorization means for performing incomplete LU factorization processing in parallel on each of several blocks in a bordered-block-diagonal coefficient matrix of the simultaneous linear equation generated by the equation generating means, a plurality of fill-in adding means for adding a plurality of fills-in generated by the individual incomplete LU factorization on the blocks to a combined portion of coefficient matrices, in parallel, a plurality of line collection ILU factorization means for ILU-factorizing each of several line collections on the combined portion where the fills-in are added, a convergent solution judging means for repeating a series of processing by the equation generating means, the block ILU factorization means, the fill-in adding means, and the line collection ILU factorization means until convergence of a solution in the simultaneous linear equation generated by the equation generating means, and an operation repeating means for repeating a series of iteration processing by the equation generating means, the block ILU factorization means, the fill-in adding means, the line collection ILU factorization means, and the convergent solution judging means at the time point decided by the point deciding means until the time point reaches a predetermined final time.

In the preferred construction, the simulation device further comprises a result output means for supplying processing results of the line collection ILU factorization means, at the time points decided by the point deciding means by the final time, when the convergent solution judging means judges that the simultaneous linear equation has converged on a solution.

In the preferred construction, the block ILU factorization means, the fill-in adding means, and the line collection ILU factorization means respectively consist of a plurality of processors moving in parallel.

According to the second aspect of the invention, a simulation device for simulating an operation of an electronic circuit, comprises a plurality of data processing means for executing a simulation of an electronic circuit operation, in various methods different in processing speed and convergence capacity of a solution, by use of the implicit integration formula and the Newton iteration method, a processing selecting means for selecting a data processing means having the highest processing speed and the lowest convergence capacity, of the plurality of data processing means, so to perform a simulation, a time-detecting means for detecting iteration times by the Newton iteration method in the processing of the data processing means which performed the simulation, and a processing switching means for controlling the processing selecting means so as to sequentially switch the data processing means to that one having the higher processing speed and the lower convergence capacity next to the data processing means which performed the simulation, when the iteration times detected by the time-detecting means is beyond a predetermined allowed time;

wherein one of the plurality of data processing means further comprises a data input means for receiving description data of an electronic circuit to be simulated, a data partitioning means for partitioning the description data of the electronic circuit received from the data input means so to generate each description data of partial circuits, a point deciding means for deciding a time point of the next stage for the description data of the partial circuit generated by the data partitioning means, an equation generating means for generating a simultaneous linear equation by application of the implicit integration formula and the Newton iteration method to the description data of the partial circuit where a time point of the next stage has been decided by the point deciding means, a plurality of block ILU factorization means for performing incomplete LU factorization processing in parallel on each of several blocks in a bordered-block-diagonal coefficient matrix of the simultaneous linear equation generated by the equation generating means, a plurality of fill-in adding means for adding a plurality of fills-in generated by the individual incomplete LU factorization on the blocks to a combined portion of coefficient matrices, in parallel, a plurality of line collection ILU factorization means for ILU-factorizing each of several line collections on the combined portion where the fills-in are added, a convergent solution judging means for repeating a series of processing by the equation generating means, the block ILU factorization means, the fill-in adding means, and the line collection ILU factorization means until convergence of a solution in the simultaneous linear equation generated by the equation generating means, and an operation repeating means for repeating a series of iteration processing by the equation generating means, the block ILU factorization means, the fill-in adding means, the line collection ILU factorization means, and the convergent solution judging means at the time point decided by the point deciding means until the time point reaches a predetermined final time.

In the preferred construction, the of data processing means further comprises a result output means for supplying processing results of the line collection ILU factorization means, at the time points decided by the point deciding means by the final time, when the convergent solution judging means judges that the simultaneous linear equation has converged on a solution.

In another preferred construction, the block ILU factorization means, the fill-in adding means, and the line collection ILU factorization means respectively consist of a plurality of processors moving in parallel.

According to the third aspect of the invention, a simulation method for simulating an operation of an electronic circuit, comprising the steps of a step of receiving description data of an electronic circuit to be simulated, a step of partitioning the description data of the electronic circuit so to generate each description data of partial circuits, a step of deciding a time point of the next stage for the description data of the partial circuit generated by the data partitioning step, a step of generating a simultaneous linear equation by application of the implicit integration formula and the Newton iteration method to the description data of the partial circuit where a time point of the next stage has been decided by the point deciding step, a step of performing incomplete LU factorization processing in parallel on each of several blocks in a bordered-block-diagonal coefficient matrix of the simultaneous linear equation generated by the equation generating step, a step of adding a plurality of fills-in generated by the individual incomplete LU factorization on the blocks to a combined portion of coefficient matrices, in parallel, a step of ILU-factorizing each of several line collections on the combined portion where the fills-in are added, a step of repeating a series of processing by the equation generating step, the block ILU factorization step, the fill-in adding step, and the line collection ILU factorization step until convergence of a solution in the simultaneous linear equation generated by the equation generating step, and a step of repeating a series of iteration processing by the equation generating step, the block ILU factorization step, the fill-in adding step, the line collection ILU factorization step, and the convergent solution judging step at the time point decided by the point deciding step until the time point reaches a predetermined final time.

In the preferred construction, the simulation method further comprises a step of supplying processing results of the line collection ILU factorization step, at the time points decided by the point deciding step by the final time, when the convergent solution judging step judges that the simultaneous linear equation has converged on a solution.

According to the fourth aspect of the invention, a simulation method for simulating an operation of an electronic circuit, comprising the steps of a step of selecting a data processing means having the highest processing speed and the lowest convergence capacity, of a plurality of data processing means for executing a simulation of an electronic circuit operation, in various methods different in processing speed and convergence capacity of a solution, by use of the implicit integration formula and the Newton iteration method, thereby performing a simulation, a step of detecting iteration times by the Newton iteration method in the processing of the data processing means which performed the simulation, and a step of controlling the processing selecting step so as to sequentially switch the data processing means to that one having the higher processing speed and the lower convergence capacity next to the data processing means which performed the simulation, when the iteration times detected by the time-detecting step is beyond a predetermined allowed time, wherein one of the processing by the plurality of data processing means further includes a step of receiving description data of an electronic circuit to be simulated, a step of partitioning the description data of the electronic circuit received from the data input step so to generate each description data of partial circuits, a step of deciding a time point of the next stage for the description data of the partial circuit generated by the data partitioning step, a step of generating a simultaneous linear equation by application of the implicit integration formula and the Newton iteration method to the description data of the partial circuit where a time point of the next stage has been decided by the point deciding step, a step of performing incomplete LU factorization processing in parallel on each of several blocks in a bordered-block-diagonal coefficient matrix of the simultaneous linear equation generated by the equation generating step, a step of adding a plurality of fills-in generated by the individual incomplete LU factorization on the blocks to a combined portion of coefficient matrices, in parallel, a step of ILU-factorizing each of several line collections on the combined portion where the fills-in are added, a step of repeating a series of processing by the equation generating step, the block ILU factorization step, the fill-in adding step, and the line collection ILU factorization step until convergence of a solution in the simultaneous linear equation generated by the equation generating step, and a step of repeating a series of iteration processing by the equation generating step, the block ILU factorization step, the fill-in adding step, the line collection ILU factorization step, and the convergent solution judging step at the time point decided by the point deciding step until the time point reaches a predetermined final time.

According to a further aspect of the invention, a computer readable memory storing a control program for controlling a simulation device for simulating an operation of an electronic circuit, the control program comprising the steps of a step of receiving description data of an electronic circuit to be simulated, a step of partitioning the description data of the electronic circuit received from the data input step so to generate each description data of partial circuits, a step of deciding a time point of the next stage for the description data of the partial circuit generated by the data partitioning step, a step of generating a simultaneous linear equation by application of the implicit integration formula and the Newton iteration method to the description data of the partial circuit where a time point of the next stage has been decided by the point deciding step, a step of performing incomplete LU factorization processing in parallel on each of several blocks in a bordered-block-diagonal coefficient matrix of the simultaneous linear equation generated by the equation generating step, a step of adding a plurality of fills-in generated by the individual incomplete LU factorization on the blocks to a combined portion of coefficient matrices, in parallel, a step of ILU-factorizing each of several line collections on the combined portion where the fills-in are added, a step of repeating a series of processing by the equation generating step, the block ILU factorization step, the fill-in adding step, and the line collection ILU factorization step until convergence of a solution in the simultaneous linear equation generated by the equation generating step, and a step of repeating a series of iteration processing by the equation generating step, the block ILU factorization step, the fill-in adding step, the line collection ILU factorization step, and the convergent solution judging step at the time point decided by the point deciding step until the time point reaches a predetermined final time.

According to a still further aspect of the invention, a computer readable memory storing a control program for controlling a simulation device for simulating an operation of an electronic circuit, the control program comprising the steps of a step of selecting a data processing means having the highest processing speed and the lowest convergence capacity, of a plurality of data processing means for executing a simulation of an electronic circuit operation, in various methods different in processing speed and convergence capacity of a solution, by use of the implicit integration formula and the Newton iteration method, thereby performing a simulation, a step of detecting iteration times by the Newton iteration method in the processing of the data processing means which performed the simulation, and a step of controlling the processing selecting step so as to sequentially switch the data processing means to that one having the higher processing speed and the lower convergence capacity next to the data processing means which performed the simulation, when the iteration times detected by the time-detecting step is beyond a predetermined allowed time, wherein one of the processing by the plurality of data processing means further includes a step of receiving description data of an electronic circuit to be simulated, a step of partitioning the description data of the electronic circuit received from the data input step so to generate each description data of partial circuits, a step of deciding a time point of the next stage for the description data of the partial circuit generated by the data partitioning step, a step of generating a simultaneous linear equation by application of the implicit integration formula and the Newton iteration method to the description data of the partial circuit where a time point of the next stage has been decided by the point deciding step, a step of performing incomplete LU factorization processing in parallel on each of several blocks in a bordered-block-diagonal coefficient matrix of the simultaneous linear equation generated by the equation generating step, a step of adding a plurality of fills-in generated by the individual incomplete LU factorization on the blocks to a combined portion of coefficient matrices, in parallel, a step of ILU-factorizing each of several line collections on the combined portion where the fills-in are added, a step of repeating a series of processing by the equation generating step, the block ILU factorization step, the fill-in adding step, and the line collection ILU factorization step until convergence of a solution in the simultaneous linear equation generated by the equation generating step, and a step of repeating a series of iteration processing by the equation generating step, the block ILU factorization step, the fill-in adding step, the line collection ILU factorization step, and the convergent solution judging step at the time point decided by the point deciding step until the time point reaches a predetermined final time.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessarily obscure the present invention.

Figure 1:
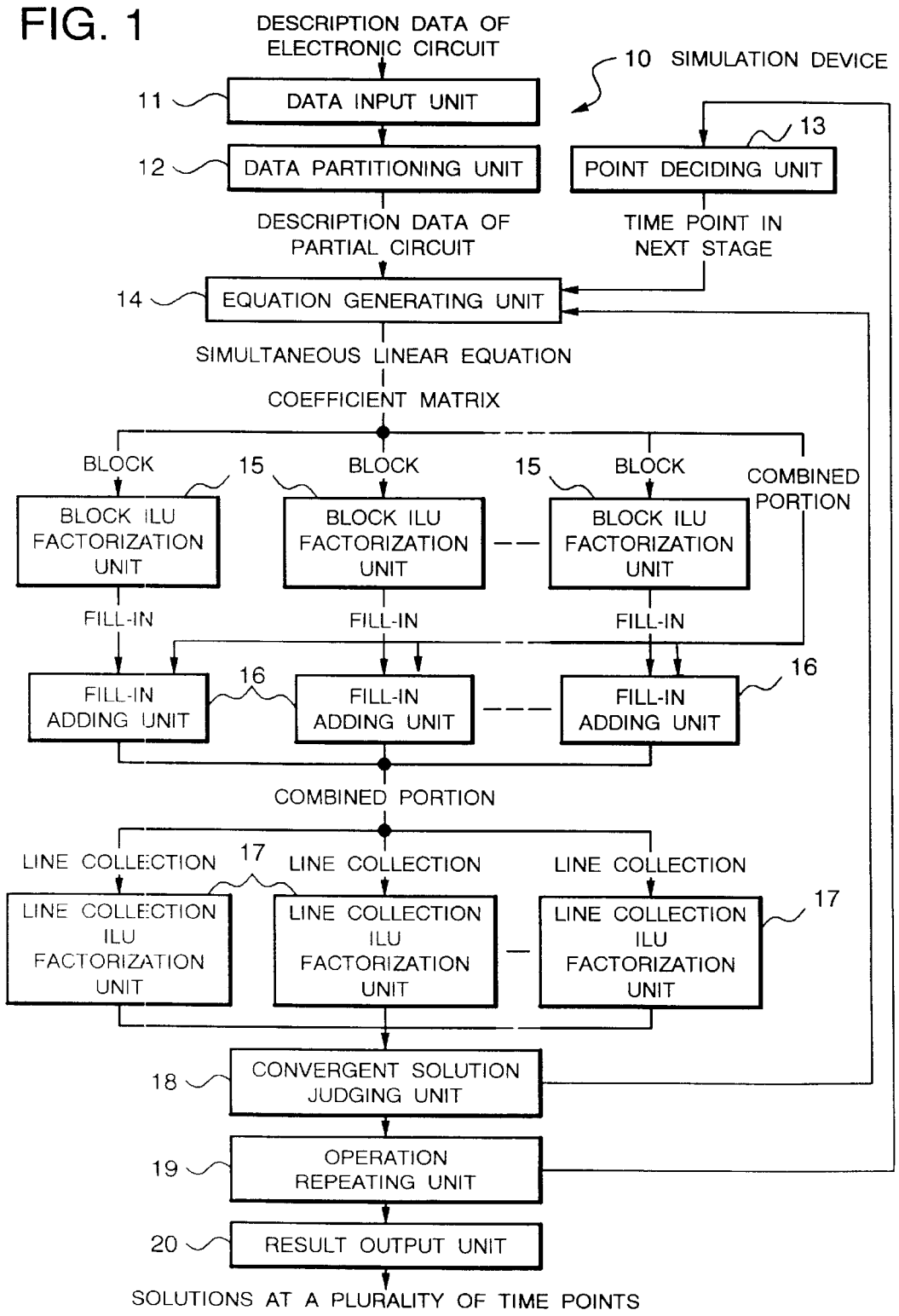
FIG. 1 is a block diagram showing the logical structure of a simulation device according to an embodiment of the present invention.
Figure 2:
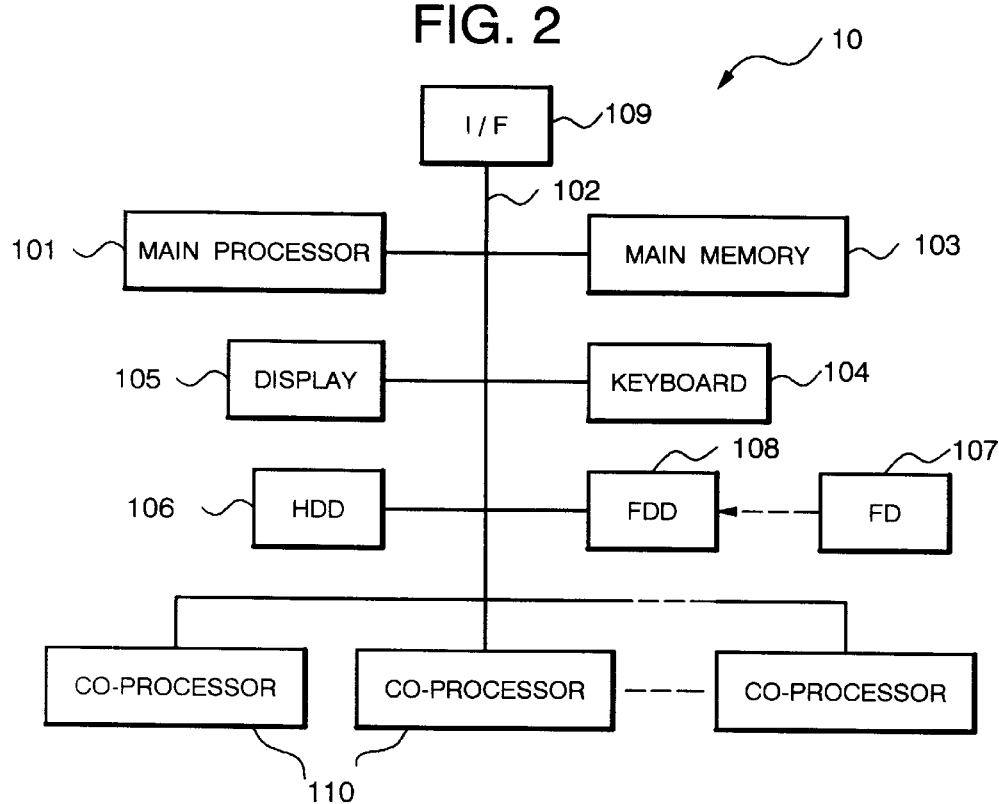
FIG. 2 is a block diagram showing the physical structure of a simulation device according to the embodiment.
Figure 3:
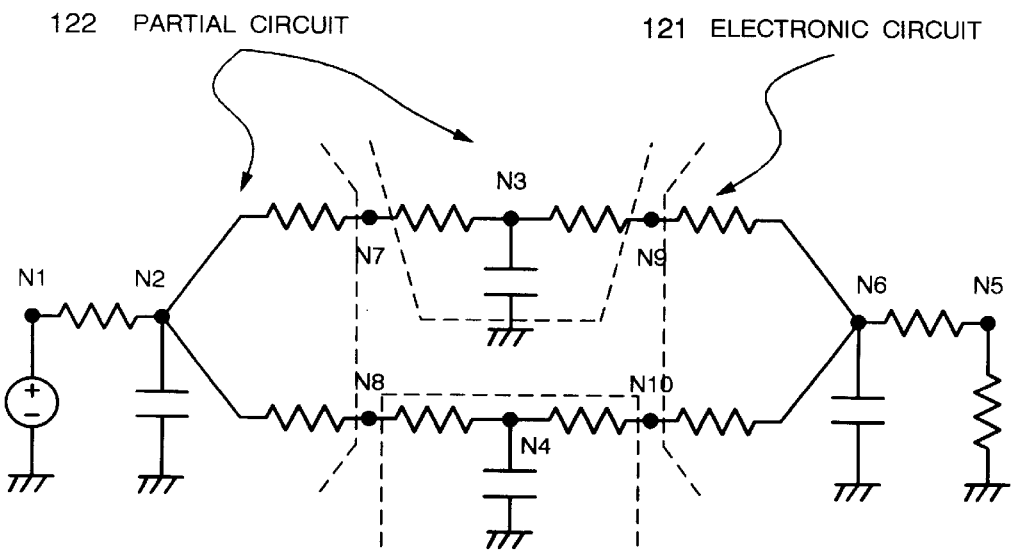
FIG. 3 is a circuit diagram showing an example of an electronic circuit to be processed.
Figure 4:
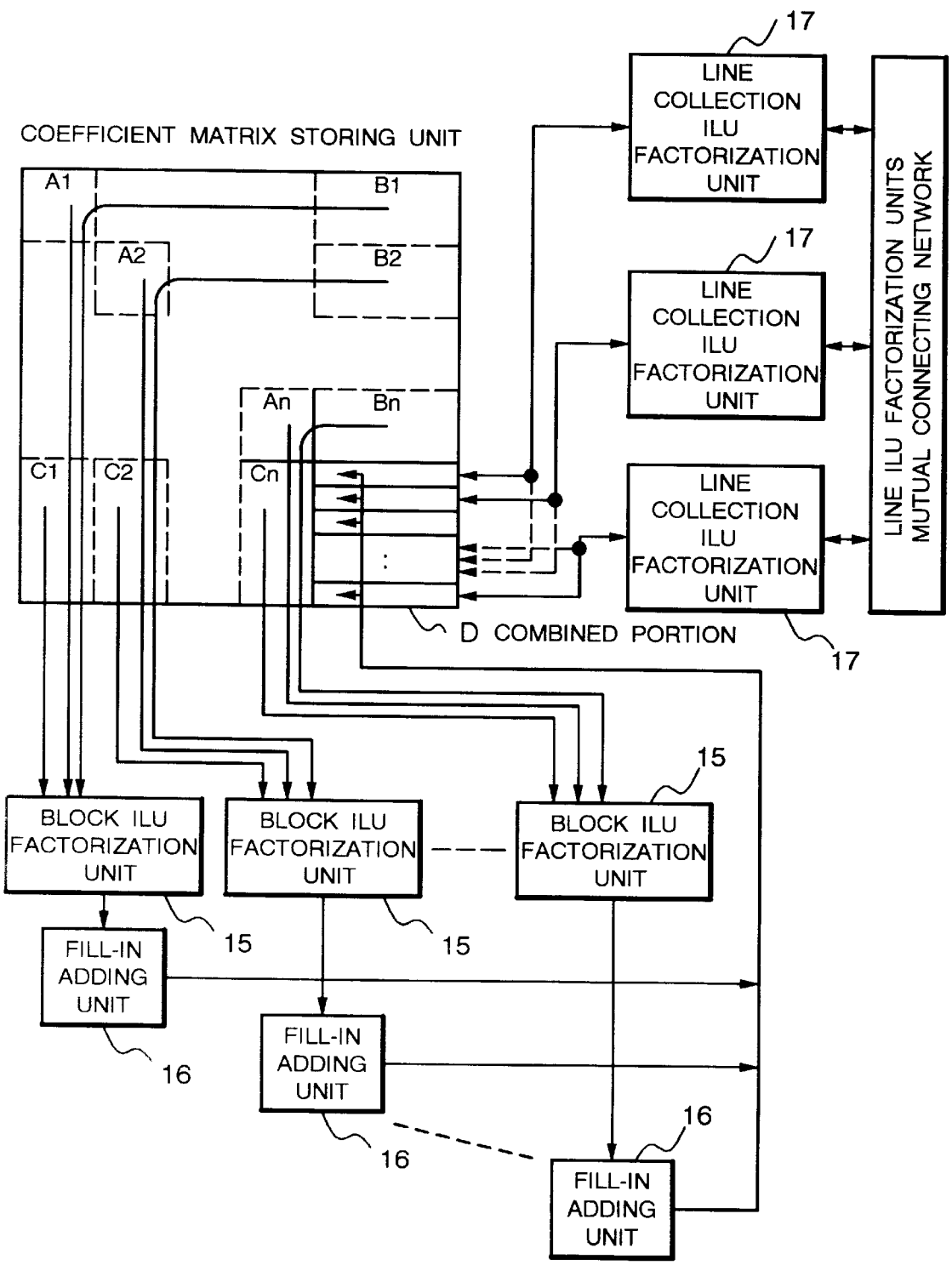
FIG. 4 is a schematic diagram showing the relationship between each processing and a bordered-block-diagonal coefficient matrix of a simultaneous linear equation.
Figure 5:
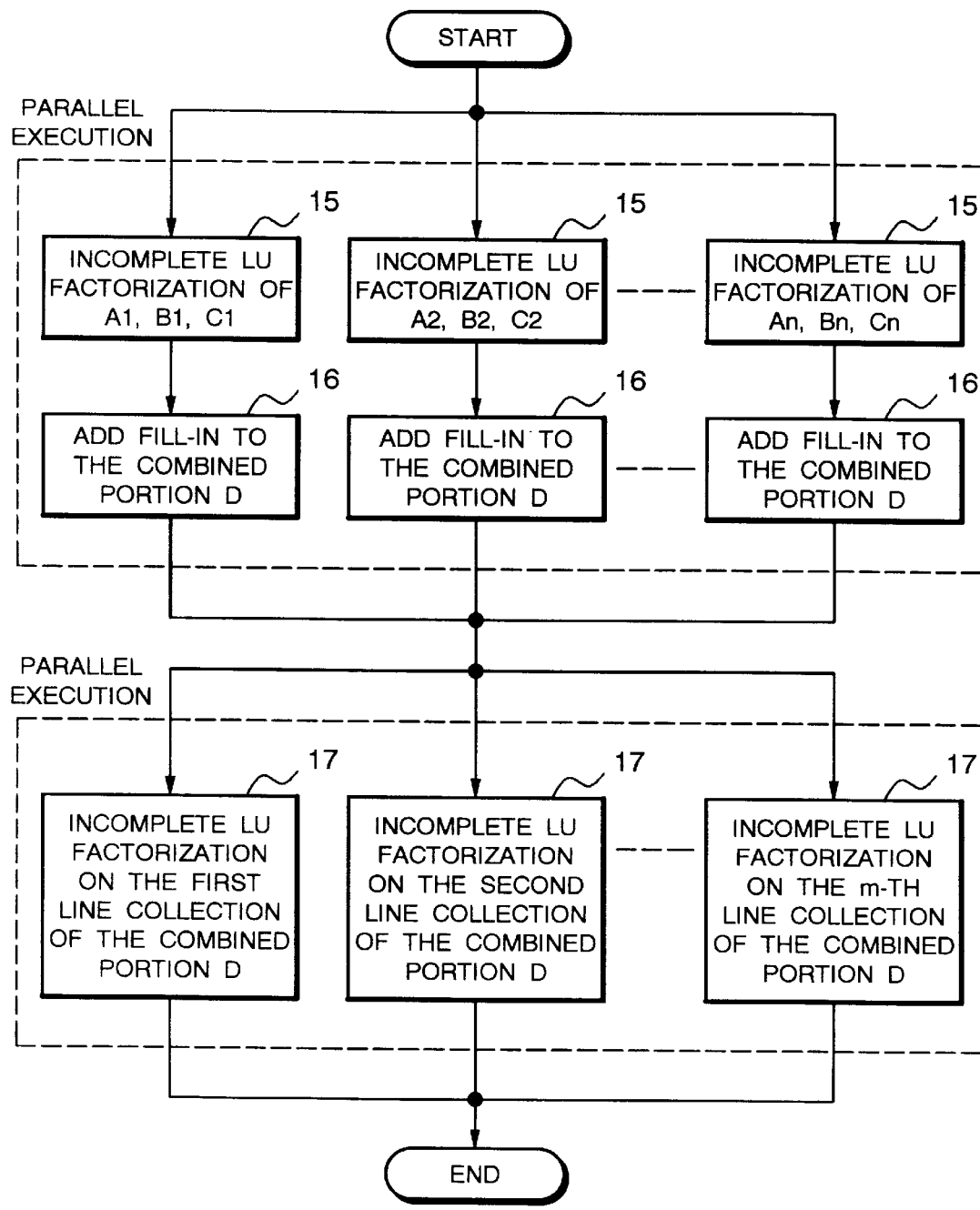
FIG. 5 is a schematic diagram showing the relationship of various processing executed in parallel.
Figure 6:
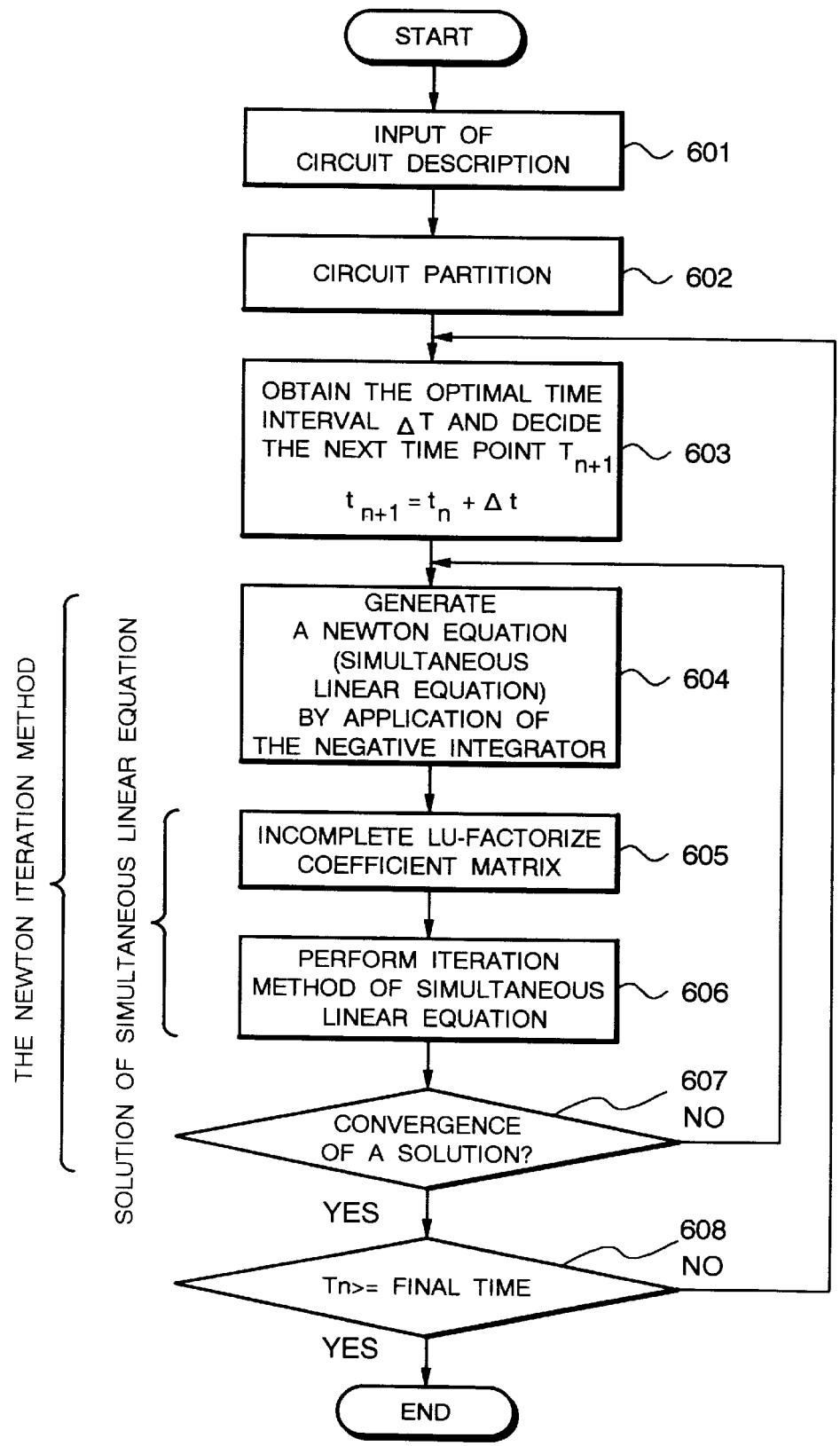
FIG. 6 is a flow chart showing the data processing operation according to the embodiment.
Figure 7:
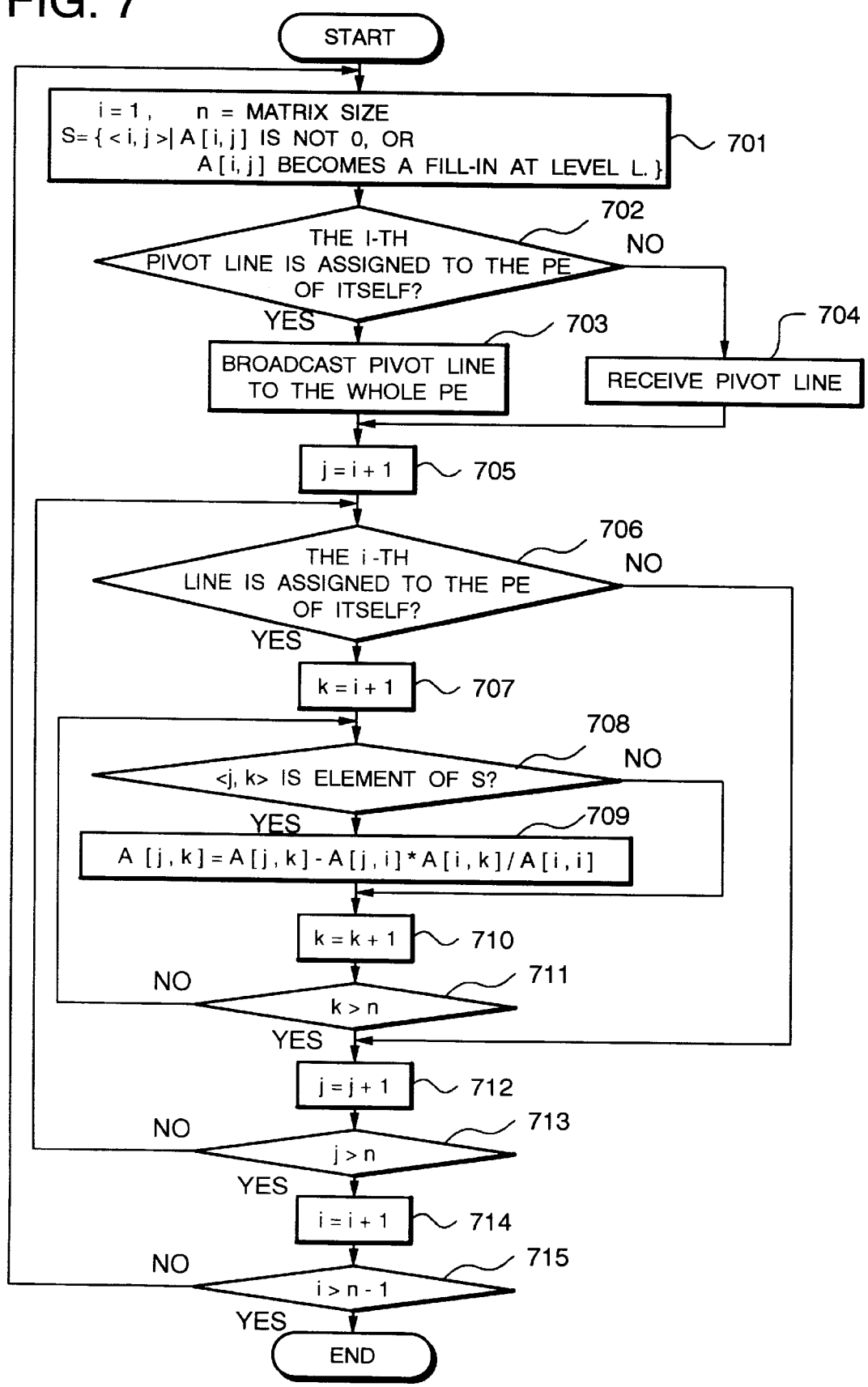
FIG. 7 is a flow chart showing the processing operation of the ILU factorization.
Figure 8:
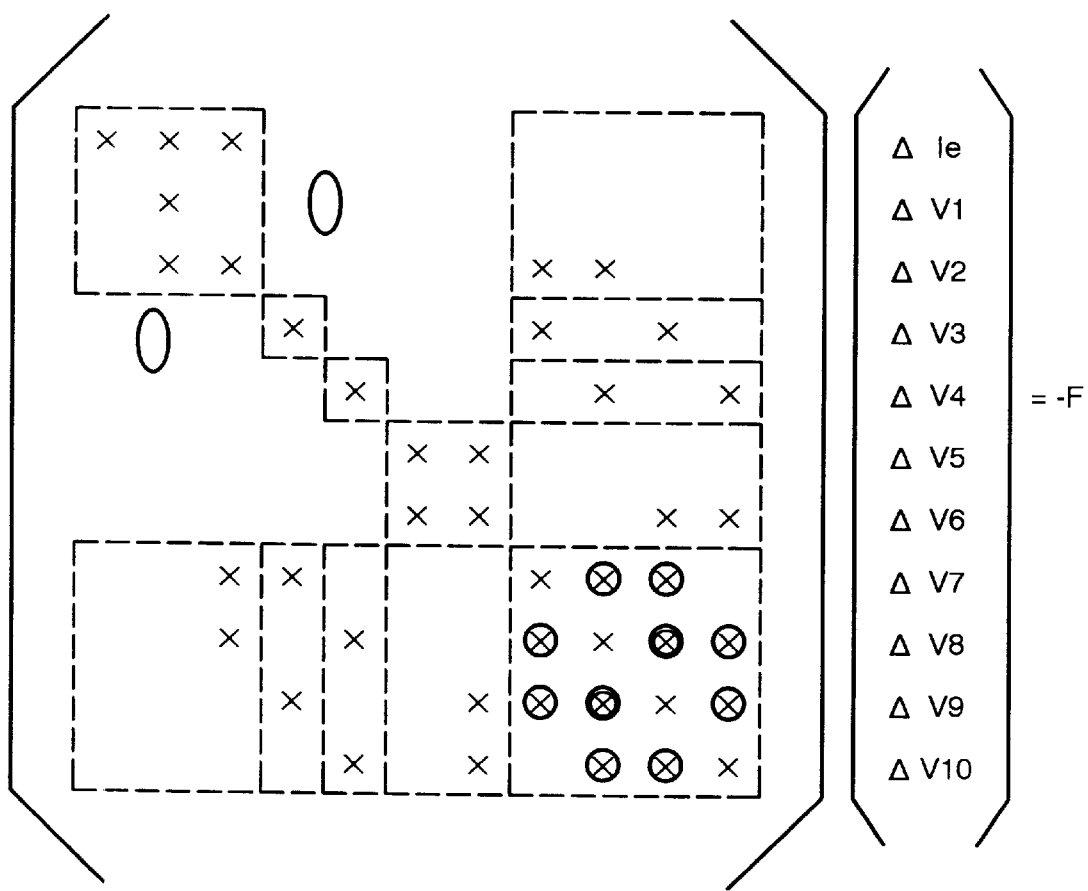
FIG. 8 is a schematic diagram showing an example of a bordered-block-diagonal coefficient matrix of a simultaneous linear equation.
Figure 9:
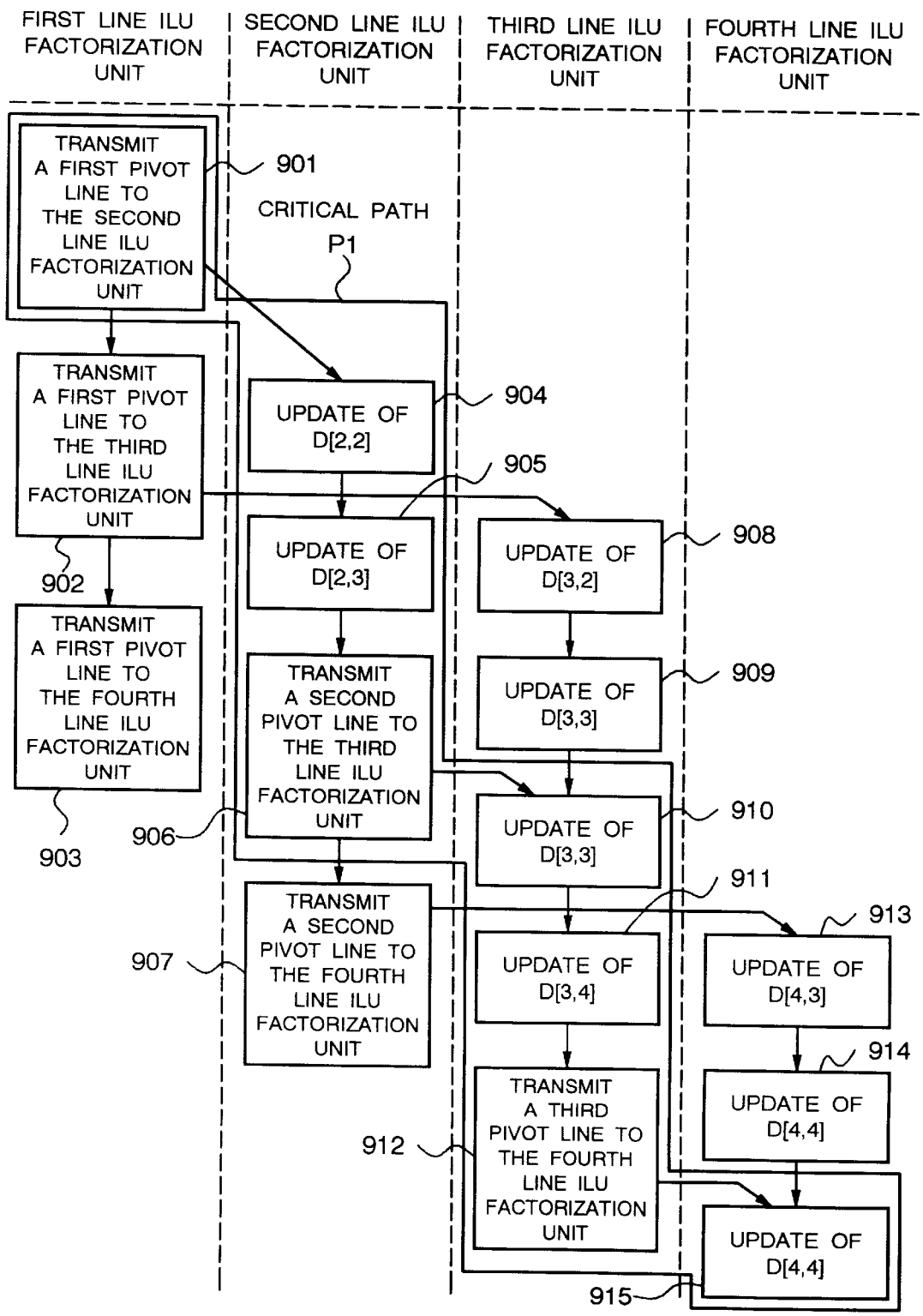
FIG. 9 is a schematic diagram showing the dependency relation among a plurality of operations of parallel processed ILU factorization.

FIG. 1 is a block diagram showing the logical structure of a simulation device according to an embodiment of the present invention; FIG. 2 is a block diagram showing the physical structure of a simulation device according to the embodiment; FIG. 3 is a circuit diagram showing an example of an electronic circuit to be processed; FIG. 4 is a schematic diagram showing the relationship between various processing and a bordered-block-diagonal coefficient matrix of a simultaneous linear equation; FIG. 5 is a schematic diagram showing the relationship of various processing executed in parallel; FIG. 6 is a flow chart showing the data processing operation according to the embodiment; FIG. 7 is a flow chart showing the processing operation of the ILU factorization; FIG. 8 is a schematic diagram showing an example of a bordered-block-diagonal coefficient matrix of a simultaneous linear equation; and FIG. 9 is a schematic diagram showing the dependency relation among a plurality of operations of parallel processed ILU factorization.

The simulation device 10 of the embodiment may be realized by a computer system such as a work station, a personal computer, or the like, and provided with a main processor 101 as a main device for processing the data as illustrated in FIG. 2. The main processor 101 is connected to a main memory 103, a key board 104, a display 105, a HDD (Hard Disk Drive) 106, a FDD (Floppy Disk Drive) 108 for mounting a FD (Floppy Disk) 107, a communication I/F (Interface) 109, and a plurality of coprocessors 110, through a bus line 102. The main processor 101 and the coprocessors 110 are formed by, what is called, a microcomputer and provided with a CPU connected to a ROM and a RAM.

Each program and data necessary for various operations is stored as software in the information storing medium including each internal ROM and RAM of the processors 101 and 110, the main memory 103, the HDD 106, and the FD 107. For example, a control program for instructing the processors 101 and 110 to perform each operation is provided, written in the FD 107. The relevant software is previously installed in the HDD 106, and at the activation of the simulation device 10, it is copied in the internal RAM of the processors 101 and 110.

Each function executing unit may be realized by the processors 101 and 110 performing various operations according to a proper program. With reference to FIG. 1, the simulation device 10 of the embodiment comprises a data input unit 11, a data partitioning unit 12, a point deciding unit 13, an equation generating unit 14, a plurality of block ILU factorization units 15, a plurality of fill-in adding units 16, a plurality of line collection ILU factorization units 17, a convergent solution judging unit 18, an operation repeating unit 19, and a result output unit 20.

In the above components, the data input unit 11 accepts the entry of description data of an electronic circuit 121. For example, the main processor 101 moving according to the control program stores the description data supplied with the key board 104 or through the communication I/F 109 into the main memory 103, thereby performing the entry of the description data of the electronic circuit 121. The supplied description data, consisting of a data file of digital information with the relationship among various elements described there, of the electronic circuit 121 as illustrated in FIG. 3, can be read out by the processors 101 and 110.

The data partitioning unit 12 partitions the description data of the electronic circuit 121 supplied by the data input unit 11, so to generate the description data of a partial circuit 122. The electronic circuit 121 is partitioned according to a predetermined algorithm. For example, the electronic circuit 121 is partitioned into four partial circuits 122 as illustrated in FIG. 3.

The point deciding unit 13 decides a time point of the next stage for the description data of the partial circuit 122. A time point means the time of sampling the sequential operations of the electronic circuit 121 and it is decided properly based on the predetermined algorithm.

The equation generating unit 14 generates a simultaneous linear equation by the application of the implicit integration formula and the Newton iteration method to the description data of the partial circuit 122 having the time point of the next stage decided by the point deciding unit 13. The generated simultaneous linear equation supplies a plurality of blocks in a bordered-block-diagonal matrix as a part as illustrated in FIG. 4, and for example, it is temporarily stored in the main memory 103 for use in the processing of the processors 101 and 110.

Though the respective data processing of the above-mentioned function executing units 11 to 14 and the below-described function executing units 18 to 20 is executed by one main processor 101, the data processing of the following function executing units 15 to 17 is executed in parallel by a plurality of coprocessors 110 as illustrated in FIG. 5. Namely, in the embodiment, a series of the function executing units 15 to 17 is respectively realized by the plurality of coprocessors 110.

The plurality of block ILU factorization units 15 individually ILU-factorize each of the blocks Ai, Bi, Ci (i=1, 2, . . . ) of a bordered-block-diagonal coefficient matrix of the generated simultaneous linear equation. The plurality of fill-in adding units 16 individually add a plurality of fill-ins generated by the individual ILU factorization of the blocks Ai, Bi, and Ci to the combined portion D of the coefficient matrices. The plurality of line collection ILU factorization units 17 ILU-factorize a plurality of line collections of the combined portion D where the fill-ins are added by the fill-in adding units 16, individually in parallel.

The convergent solution judging unit 18 repeats the operations of the equation generating unit 14, the block ILU factorization units 15, the fill-in adding units 16, and the line collection ILU factorization units 17 until convergence of a solution in the simultaneous linear equation generated by the equation generating unit 14. The operation repeating unit 19 repeats the operations of the point deciding unit 13, the equation generating unit 14, the block ILU factorization units 15, the fill-in adding units 16, the line collection ILU factorization units 17, and the convergent solution judging unit 18 until when the time point reaches a predetermined final time. The result output unit 20 supplies solutions at a plurality of time points. For example, the main processor 101 moving according to the control program supplies the data stored in the main memory 103 to the display 105 or the communication I/F 109, thereby performing the output of the solution data.

The above-mentioned function executing units 11 to 20 may be realized chiefly by the processors 101 and 110 moving according to the software stored in the internal RAM, and if necessary, it may be realized by the use of the hardware such as the key board 104, the display 105, or the like. The software is stored in the respective internal memories of the processors 101 and 110 or the other information storing medium as a control program as follows. Namely, the control program is designed to make the main processor 101 execute the data processing including acceptance of the input description data of the electronic circuit 121 by the communication I/F 109 or the like, generation of the description data of the partial circuit 122 after partitioning the input description data of the electronic circuit 121, decision of a time point of the next stage for the description data of the partial circuit 122, and generation of a simultaneous linear equation by the application of the implicit integration formula and the Newton iteration method to the description data of the partial circuit 122 in which the time point of the next stage has been decided.

It is also designed to make a plurality of coprocessors 110 execute the data processing including parallel ILU factorization of each block Ai, Bi, Ci (i=1, 2, . . . ) of a bordered-block-diagonal coefficient matrix of the generated simultaneous linear equation, parallel addition of the fill-ins respectively generated by the parallel ILU factorization of the blocks Ai, Bi, Ci, to the combined portion D of the coefficient matrices, parallel ILU factorization of the line collections of the combined portion D where the fill-ins are added. It is also designed to make the main processor 101 execute the data processing including iteration of the operation from the generation of a simultaneous linear equation to the ILU factorization of a line collection until convergence of a solution, repetition of the operation from the decision of a time point of the next stage to the convergence of a solution until when the time point reaches the predetermined final time, and data output of solutions at a plurality of time points by the communication I/F 109 or the like.

This time, the data processing operation by the simulation device 10 of the embodiment constituted as mentioned above will be described. With reference to FIG. 6, a series of processing by the main processor 101 will start upon receipt of the description data of the electronic circuit 121 (Step 601), in the embodiment. Namely, the input description data of the electronic circuit 121 is partitioned so as to generate the description data of the partial circuit 122 as illustrated in FIG. 3 (Step 602). A time point of the next stage is decided for the description data of the partial circuit 122 (Step 603), and the implicit integration formula and the Newton iteration method are applied to the description data of the partial circuit 122 where the time point of the next stage has been decided, so as to generate a simultaneous linear equation (Step 604).

Parallel processing by the coprocessors 110 is executed, each of the blocks Ai, Bi, Ci of the bordered-block-diagonal coefficient matrix is ILU-factorized (refer to Steps 701 to 715 in FIG. 7), and generated fill-ins are added in parallel to the combined portion D of the coefficient matrices (Step 605). Each of the line collections of the combined portion D where the fill-ins are added is ILU-factorized in the data processing as shown in FIG. 7 (Step 606).

The main processor 101 controls the parallel processing by the plurality of coprocessors 110 and repeats the operation from Step 604 to Step 606 until convergence of a solution in the simultaneous linear equation obtained in Step 604 (Step 607). Since the converged solution reflects the operation of the electronic circuit 121 at the same time point, the operation from Step 603 to Step 607 will be repeated until when the time point reaches the predetermined final time (Step 608). The obtained solutions at the several time points are supplied as the data.

As mentioned above, according to the data processing method of the simulation device 10 of the embodiment, the plurality of coprocessors 110 perform the parallel data processing of the ILU factorization of the blocks Ai, Bi, Ci of the coefficient matrix, the addition of the fill-ins on the combined portion D of the coefficient matrices, and the ILU factorization of the line collections of the combined portion D, with no existence of a sequential execution for the results of the parallel processing. Therefore, the number of parallel processing may be increased with increasing number of coprocessors 110, which will directly result in shortening the processing time. Mounting of many coprocessors 110 could realize a high speed simulation on a large-scale electronic circuit 121.

For example, when the ILU factorization is performed on the combined portion of the coefficient matrices having non-zero elements in parallel at the level L=2 by four line collection ILU factorization units 17 as illustrated in FIG. 8, each update operation and mutual dependence is as shown in FIG. 9. A sequential execution of this operation requires nine times of update operations in total. The data processing method of the embodiment, however, can complete the processing at five times of update operations if ignoring the time to transmit the pivot line.

Since the number of lines on the combined portion D ranges from hundreds to thousands in an actual large-scale electronic circuit, it is possible to shorten the processing time almost in inverse proportion to the number of parallel processing. However, it is impossible to shorten the processing time more than the execution time of critical path in every line as shown in FIG. 9 how large an increase in the number of parallel processing may be, and thereby the proper number of parallel processing is about "the time required for a sequential execution ÷ the time required for a critical path".

It is necessary to make constant the time required for broadcast of a pivot line (Step S53), without increasing it in proportion to the number of the parallel processing, in the data processing of the ILU factorization shown in FIG. 7, in order to decrease the processing time of the ILU factorization on the combined portion D substantially in inverse proportion to the number of the parallel processing. However, it is very difficult to make constant the time required for the broadcast of a pivot line in case of a large number of parallel processing. Then, one-to-one communication of the pivot line from the sending party to the receiving party by turns will be repeated. In other words, a first pivot line is first transmitted to a next line collection ILU factorization unit 17 which should hold the pivot line, and thereafter it is transmitted to a further next line collection ILU factorization unit 17 which should hold the pivot line. A pivot line is transmitted in such order (refer to Steps 901 to 903 in FIG. 9). In this case, since the communication processing of a pivot line and the numerical operation processing can be overlapped with each other, an increase amount in execution time resulting from the broadcast of a critical path becomes "the line number of the combined portion −1" times of the one-to-one high speed communication, which is constant regardless of the number of parallel processing.

To make the above-mentioned transfer control easy, every one line of the combined portion of the coefficient matrices is assigned to each line collection ILU factorization unit 17 in the same order. For example, when there are three line collection ILU factorization units, first line, fourth line, seventh line, . . . are assigned to the first line collection ILU factorization unit 17, second line, fifth line, eighth line, . . . are assigned to the second line collection ILU factorization unit 17, and third line, sixth line, ninth line, . . . are assigned to the third line collection ILU factorization unit 17.

The present invention is not restricted to the above-mentioned embodiment, and it is to be understood that various modifications may be made without departing from the spirit thereof. For example, in the above embodiment, a plurality of data processing which is executed in parallel is performed by the plurality of coprocessors 110, while data processing which is not executed in parallel is performed by one main processor 101. However, it is possible to make one of the coprocessors 110 perform the data processing which is not executed in parallel, so as to save the main processor 101.

In the above embodiment, the respective processors 101 and 110 are moved according to the control program stored in the internal RAM as software, thereby to realize the respective function executing units 11 to 20 of the simulation device 10. However, it is possible to form the respective function executing units 11 to 20 as the inherent hardware, or it is possible to store some of them in the internal RAM as the software and form the other of them as the hardware.

In the above embodiment, it is supposed that the software previously stored in the HDD 106 is to be copied in the internal RAMS of the processors 101 and 110 at the activation of the simulation device 10 and the software stored in the internal RAMs is to be read out by the internal CPUs of the processors 101 and 110. However, this software, being stored in the HDD 106, may be used by the processors 101 and 110 as it is, or it may be fixedly stored in the internal ROMs of the processors 101 and 110 in advance. Further, with software written in the FD 107; an information storing medium that can be handled as a single unit, the software can be installed in the internal RAMs of the processors 101 and 110 from the same FD 107. Otherwise, the software may be read out from the FD 107 directly by the processors 101 and 110 without being installed to execute the operation.

In short, when realizing the respective function executing units 11 to 20 of the simulation device 10 of the present invention with software, the software will do as far as it is in a position to be read by the processors 101 and 110 so as to execute the instructed operation. The control program for realizing the respective function executing units 11 to 20 may be formed by the combination of a plurality of software. In this case, it will do only if storing the minimum software necessary for realizing the simulation device of the present invention in the information storing medium that is a single unit of product. For example, when providing the simulation device 10 having the existing operating system installed with some application software stored in the FD 107 or the other information storing medium, the software for realizing various means of the simulation device of the present invention may be realized by the combination of the application software and the operating system, and therefore, some part of the software depending on the operating system can be omitted from the application software of the information storing medium.

Further, when there exists a simulation device with the conventional application software for simulating an electronic circuit installed therein in advance, it is also possible to supply only the part of the Newton iteration method in the control program for realizing the simulation method of the embodiment as the updated version of the application software. In this case, it will do only if the control program is stored in the FD 107 or the other information storing medium, for making the coprocessors 110 execute in parallel the data processing including the individual ILU factorization of each block Ai, Bi, Ci (i=1,2, . . . ) of the bordered-block-diagonal coefficient matrix of a simultaneous linear equation, the individual addition of the fills-in generated by the individual ILU factorization to the combined portion D of the coefficient matrices, and the individual ILU factorization of the line collections on the combined portion D where the fills-in are added.

Means for providing the processors 101 and 110 with the software written in the information storing medium is not restricted to the way of directly installing the information storing medium into the simulation device 10. For example, with the software stored in the information storing medium of a host computer, the host computer may be connected to a terminal computer via a communication network, so to supply the software from the host computer to the terminal computer through data communication. In this case, the terminal computer may execute the stand-alone operation with the software downloaded in the information storing medium of itself, or it may execute the operation through real-time data communication with the host computer without downloading the software. In the latter case, the whole system with the host computer and the terminal computer connected together via a communication network is to correspond to the simulation device of the present invention.

Figure 10:
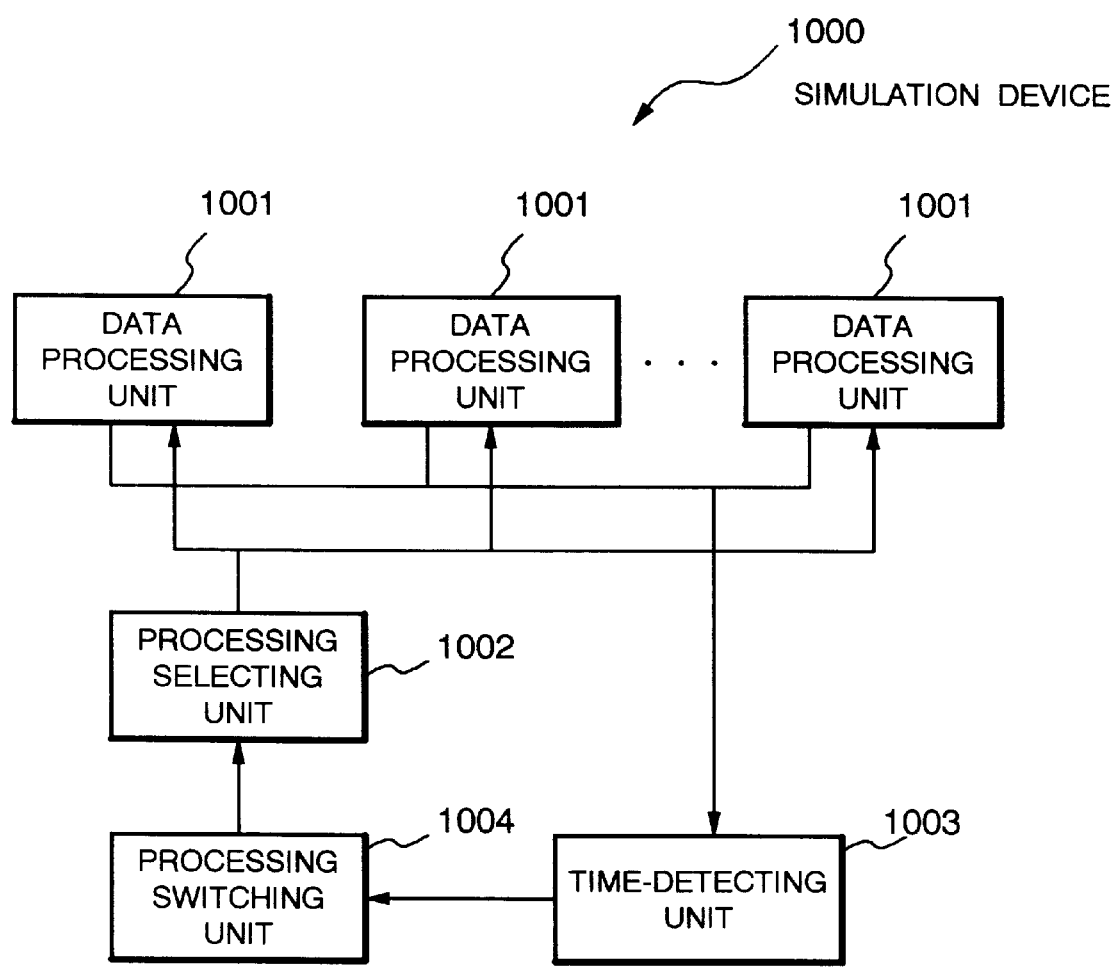
FIG. 10 is a block diagram showing the logical structure of a simulation device according to another embodiment of the present invention.
Figure 11:
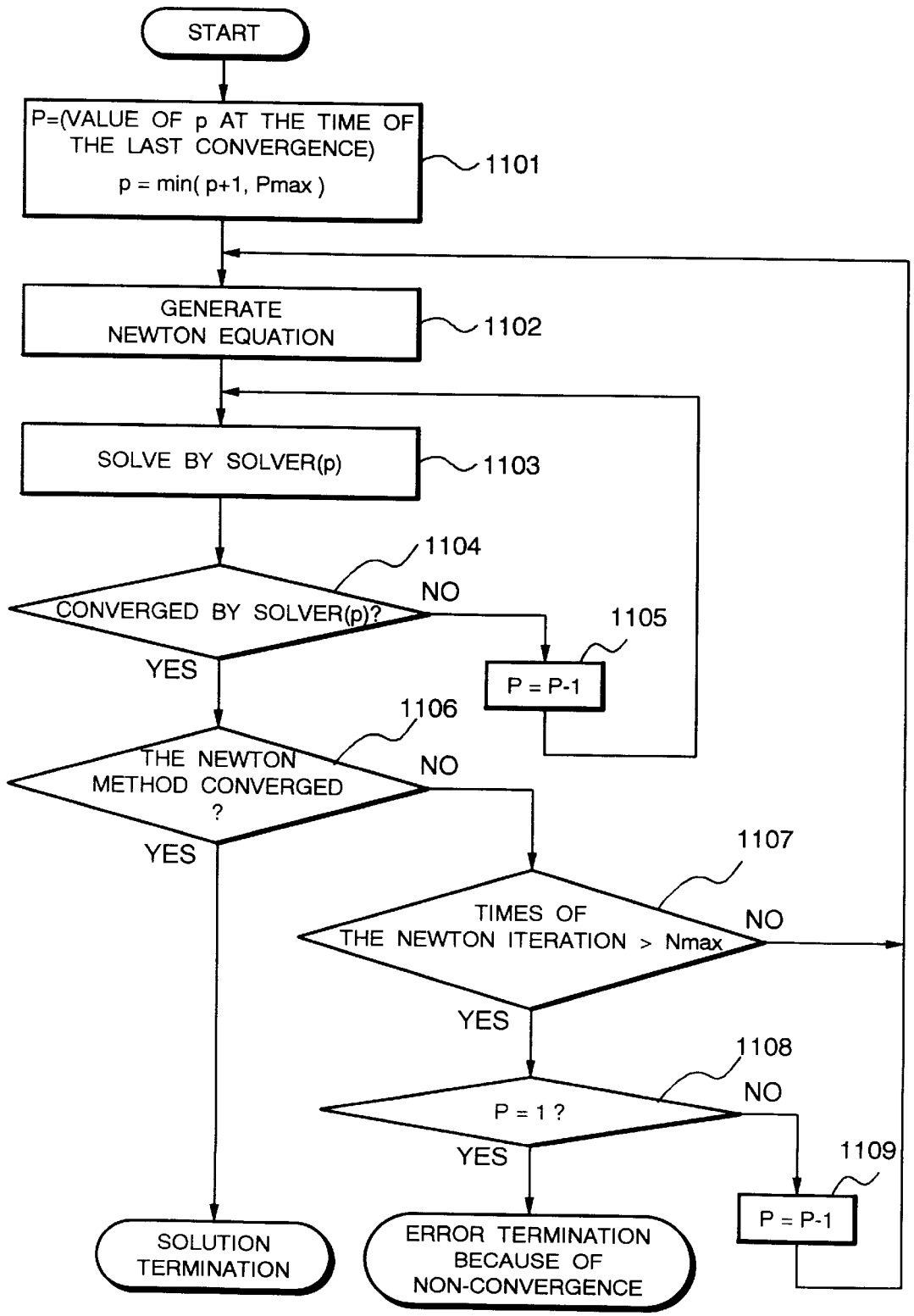
FIG. 11 is a flow chart showing the operation of the embodiment.
Figure 12:
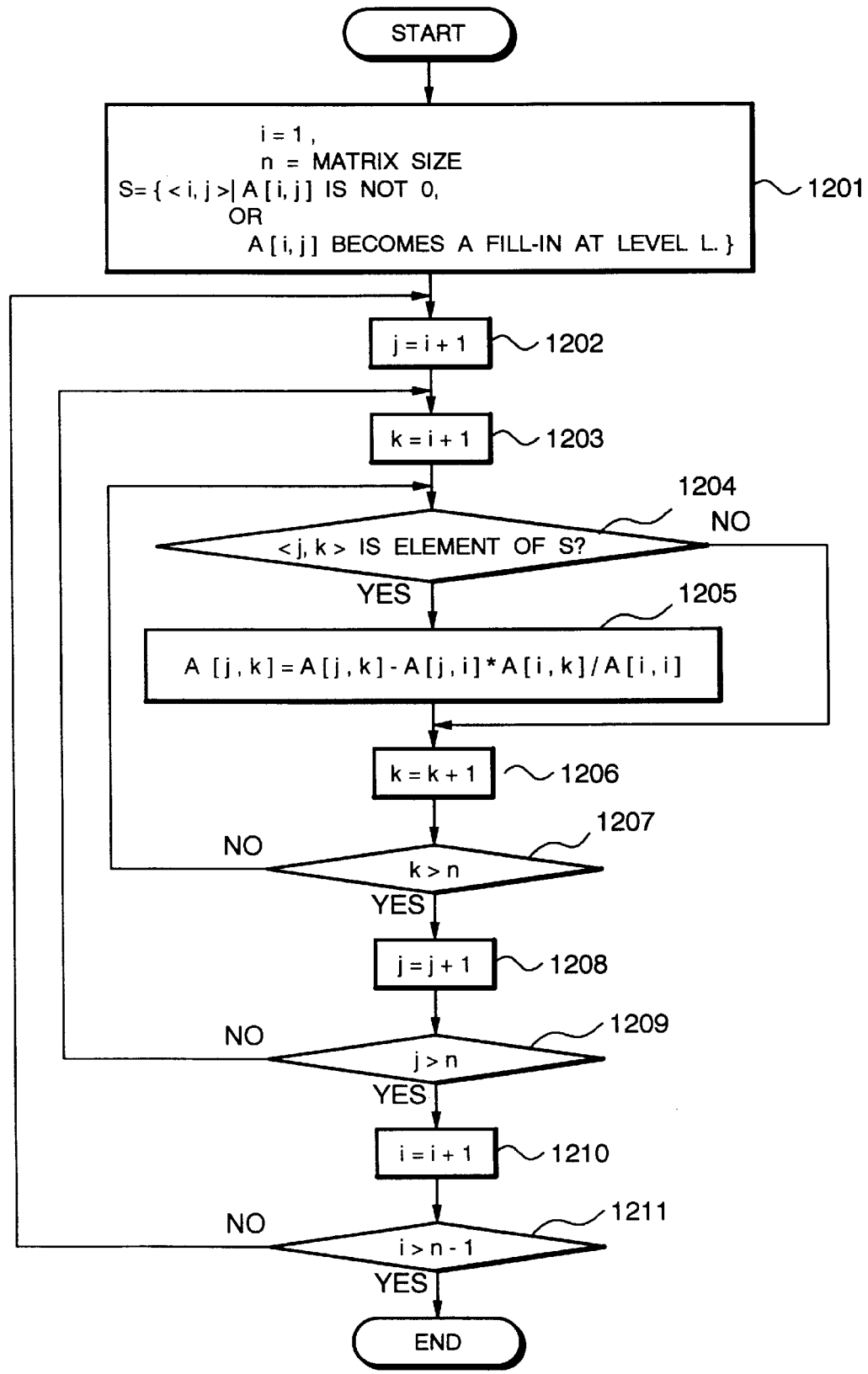
FIG. 12 is a flow chart showing the data processing method by the Newton iteration method.
Figure 13:
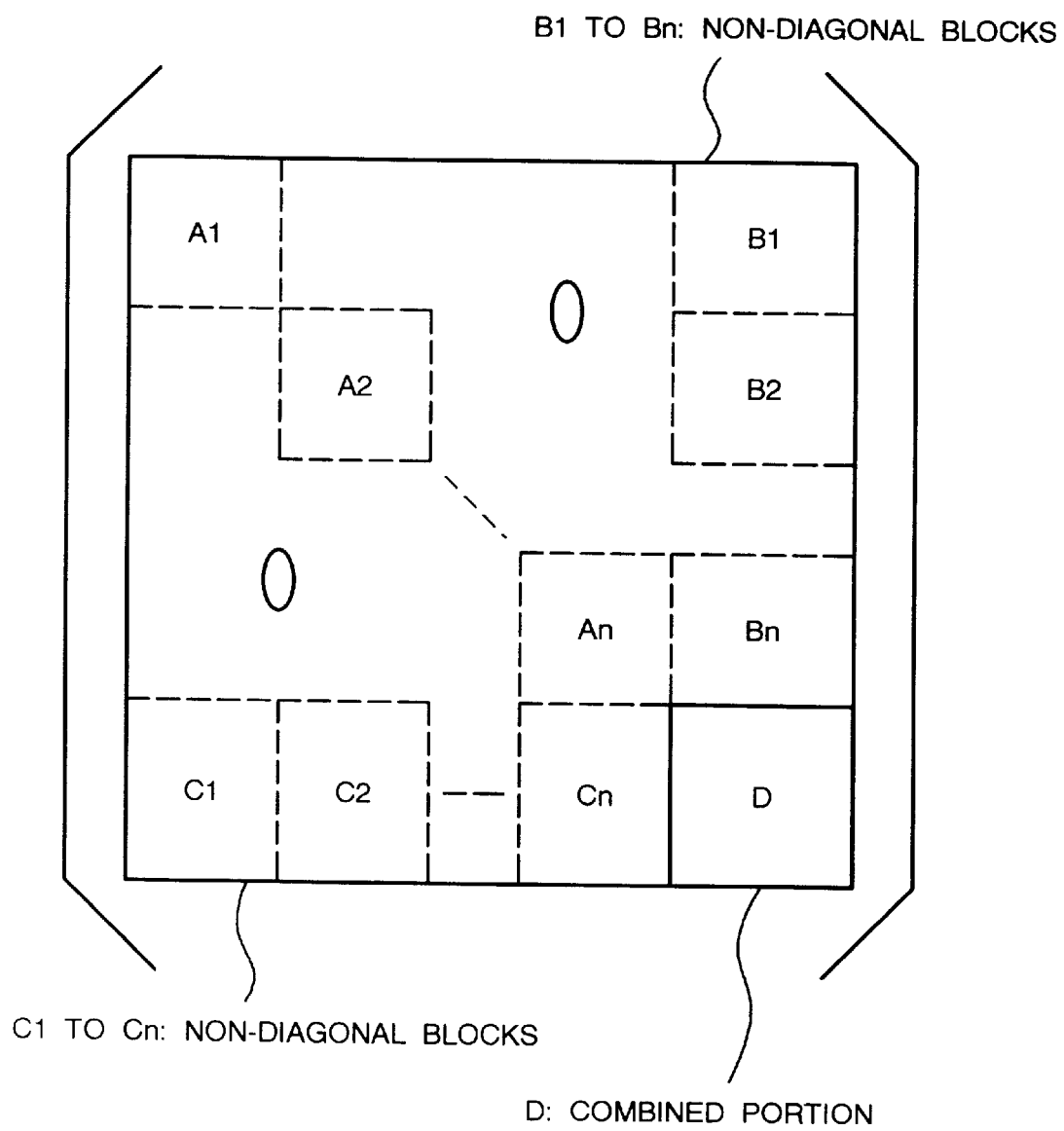
FIG. 13 is a schematic diagram showing bordered-block-diagonal coefficient matrix of a simultaneous linear equation.
Figure 14:
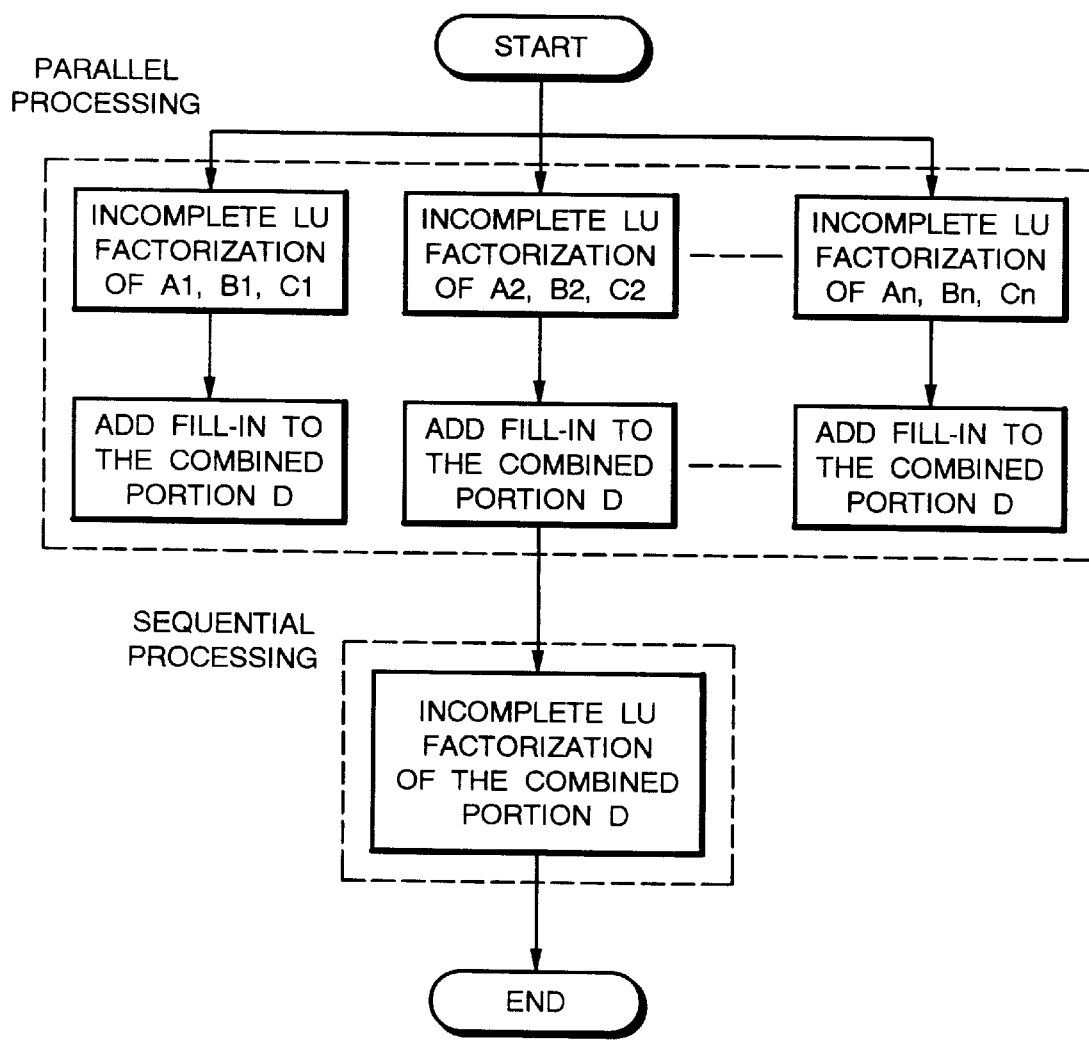
FIG. 14 is a schematic diagram showing the relationship among each processing in the conventional simulating method.

This time, a simulation device and its data processing method according to another embodiment of the present invention will be described. FIG. 10 is a block diagram showing the constitution of the simulation device of the embodiment, and FIG. 11 is a flow chart showing the operation of the embodiment.

With reference to FIG. 10, the simulation device 1000 of the embodiment comprises a plurality of data processing units 1001, a processing selecting unit 1002, a time-detecting unit 1003, and a processing switching unit 1004. One of the data processing units 1001 is to correspond to the simulation device 10 of the above-mentioned first embodiment. The other data processing units 1001 are to execute the simulation in various methods mutually different from each other in the processing speed and the convergence capacity of a solution.

In the various methods of simulating an operation of an electronic circuit, generally, the convergence capacity is low when the processing speed is fast, and the convergence capacity is high when the processing speed is slow. Therefore, in the simulation device 1000 of the embodiment, for example, when there are three kinds of solutions Pmax, a solving method having the lowest processing speed and the highest convergence capacity of a solution is set in a first data processing unit 1001, and a solving method having the highest processing speed and the lowest convergence capacity of a solution is set in a third data processing unit 1001.

More specifically, it is arranged so that the data processing unit 1001 of SOLVER(1) may execute the data processing for a solution by the Gaussian elimination (direct method), the data processing unit 101 of SOLVER(2) may execute the data processing for a solution by the ILU(4) preprocessed Bi-CGSTAB method (iteration method), and the data processing unit 1001 of SOLVER(3) may execute the data processing for a solution by the Gauss-Seidel method (iteration method). As apparent from the above arrangement, in the embodiment, the data processing unit 1001 of SOLVER(2) is to correspond to the above-mentioned simulation device 10. The operation of the three data processing units 1001 forming the simulation device 1000 of the embodiment is in common with the first embodiment until generation of the Newton equation. Solving method of a Newton equation is different and switching three data processing units 1001 establishes the optimal way of processing as mentioned below.

The processing selecting unit 1002 lets the data processing unit 1001 having the lowest convergence capacity and the highest data processing speed find a solution at first. The time-detecting unit 1003 detects the iteration times in the solving data processing unit 1001. The processing switching unit 1004 sequentially switches the solving data processing unit 1001 to the data processing unit 1001 having the higher convergence capacity and the lower processing speed when the iteration times detected by the time-detecting unit 1003 is beyond the allowed times established in advance.

In the data processing method of the simulation device 1000 of the embodiment constituted as mentioned above, a Newton equation is generated (Step 1102), and at first the data processing unit 1001 of SOLVER(3) having the lowest convergence capacity and the highest processing speed solves the Newton equation (Step 1103), as illustrated in FIG. 11. Then, the iteration times in the processing is detected and when the iteration times is beyond the allowed times established in advance, the data processing unit 1001 is switched to that one of SOLVER(2(=3−1)) having the higher convergence capacity and the lower processing speed than SOLVER(3). In the next simulation, the processing is performed by use of the switched data processing unit 1001 of SOLVER(2). Every time when the iteration times is beyond the allowed times, the data processing unit 1001 is sequentially switched to the data processing unit 1001 having the higher convergence capacity and the lower processing speed than that one having done the same processing.

According to the data processing method of the simulation device 1000 of the embodiment, a solution is found at a low convergence capacity and at a high processing speed at first, and according as the number of iteration times in the processing is increased, a solving method is sequentially switched to one of higher convergence capacity, thereby to obtain a solution finally in the optimal method.

As set forth hereinabove, the simulation device and its method of the present invention can execute each processing in parallel, including the ILU factorization of the blocks of a coefficient matrix, the fills-in addition on the combined portion of coefficient matrices, the ILU factorization of the line collections of the combined portion, and shorten the processing time effectively by increasing the number of parallel processing because there is no sequential execution processing for the results of the parallel processing, thereby to simulate a large-scale electronic circuit at a high speed.

Further, the simulation device and its method of the present invention is provided with a plurality of data processing units having various processing speed and various convergence capacity to execute a simulation while properly switching the data processing units, thereby executing the processing in the optimal data processing method balanced between processing speed and convergence capacity of a solution.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A simulation device for simulating an operation of an electronic circuit, comprising:
   a data input means for receiving description data of an electronic circuit to be simulated;
   a data partitioning means for partitioning the description data of the electronic circuit received from said data input means to generate description data of partial circuits;
   a point deciding means for deciding a time point of the next stage for the description data of the partial circuits generated by said data partitioning means;
   an equation generating means for generating a simultaneous linear equation by application of an implicit integration formula and a Newton iteration method to the description data of the partial circuits at the time point of the next stage as decided by said point deciding means;
   a plurality of block ILU factorization means for performing incomplete LU factorization processing in parallel on each of several blocks in a bordered-block-diagonal coefficient matrix of the simultaneous linear equation generated by said equation generating means to produce a plurality of fill-ins, respectively;
   a plurality of fill-in adding means for respectively adding a fill-in generated by the corresponding ILU factorization means to a combined portion of coefficient matrices, in parallel;
   a plurality of line collection ILU factorization means for respectively ILU-factorizing a corresponding one of several line collections on the combined portion, in parallel;
   a convergent solution judging means for repeating a series of processing by said equation generating means, said block ILU factorization means, said fill-in adding means, and said line collection ILU factorization means until convergence of a solution in the simultaneous linear equation generated by said equation generating means is reached;
   an operation repeating means for repeating a series of iteration processing by said equation generating means, said block ILU factorization means, said fill-in adding means, said line collection ILU factorization means, and said convergent solution judging means at the time point decided by said point deciding means until the time point reaches a predetermined final time; and
   an output means for supplying a series of convergent solutions representing the operation of the electronic circuit over time.

2. A simulation device as set forth in claim 1, wherein said block ILU factorization means, said fill-in adding means, and said line collection ILU factorization means respectively consist of a plurality of processors operating in parallel.

3. A simulation device for simulating an operation of an electronic circuit, comprising:
   a plurality of data processing means for executing a simulation of an electronic circuit operation, in various methods different in processing speed and convergence capacity of a solution, by use of an implicit integration formula and a Newton iteration method;
   a processing selecting means for selecting a data processing means having the highest processing speed and the lowest convergence capacity, of the plurality of data processing means, so to perform a simulation;
   a time-detecting means for detecting iteration times by the Newton iteration method in the processing of said data processing means which performed the simulation; and
   a processing switching means for controlling said processing selecting means so as to sequentially switch said data processing means to that one having the higher processing speed and the lower convergence capacity next to said data processing means which performed the simulation, when the iteration times detected by said time-detecting means is beyond a predetermined allowed time;
   wherein one of said plurality of data processing means further comprises
   a data input means for receiving description data of an electronic circuit to be simulated,
   a data partitioning means for partitioning the description data of the electronic circuit received from said data input means to generate description data of partial circuits,
   a point deciding means for deciding a time point of the next stage for the description data of the partial circuits generated by said data partitioning means,
   an equation generating means for generating a simultaneous linear equation by application of the implicit integration formula and the Newton iteration method to the description data of the partial circuits at the time point of the next stage as decided by said point deciding means,
   a plurality of block ILU factorization means for performing incomplete LU factorization processing in parallel on each of several blocks in a bordered-block-diagonal coefficient matrix of the simultaneous linear equation generated by said equation generating means to produce a plurality of fill-ins, respectively, a plurality of fill-in adding means for respectively adding a fill-in generated by the corresponding ILU factorization means to a combined portion of coefficient matrices, in parallel, a plurality of line collection ILU factorization means for respectively ILU-factorizing a corresponding one of several line collections on the combined portion, in parallel, a convergent solution judging means for repeating a series of processing by said equation generating means, said block ILU factorization means, said fill-in adding means, and said line collection ILU factorization means until convergence of a solution in the simultaneous linear equation generated by said equation generating means is reached, an operation repeating means for repeating a series of iteration processing by said equation generating means, said block ILU factorization means, said fill-in adding means, said line collection ILU factorization means, and said convergent solution judging means at the time point decided by said point deciding means until the time point reaches a predetermined final time, and an output means for supplying a series of convergent solutions representing the operation of the electronic circuit over time.

4. A simulation device as claimed in claim 3, wherein said block ILU factorization means, said fill-in adding means, and said line collection ILU factorization means respectively consist of a plurality of processors operating in parallel.

5. A simulation method for simulating an operation of an electronic circuit, comprising the steps of:

a step of receiving description data of an electronic circuit to be simulated;

a step of partitioning the description data of the electronic circuit to generate description data of partial circuits;

a step of deciding a time point of the next stage for the description data of the partial circuits generated by said data partitioning step;

a step of generating a simultaneous linear equation by application of an implicit integration formula and a Newton iteration method to the description data of the partial circuits at the time point of the next stage as decided by said point deciding step;

a step of performing incomplete LU factorization processing in parallel on each of several blocks in a bordered-block-diagonal coefficient matrix of the simultaneous linear equation generated by said equation generating step to produce a plurality of fill-ins, respectively;

a step of respectively adding a fill-in generated by the corresponding ILU factorization means to a combined portion of coefficient matrices, in parallel;

a step of respectively ILU-factorizing a corresponding one of several line collections on the combined portion, in parallel;

a step of repeating a series of processing by said equation generating means, said block ILU factorization means, said fill-in adding means, and said line collection ILU factorization means until convergence of a solution in the simultaneous linear equation generated by said equation generating means is reached;

a step of repeating a series of iteration processing by said equation generating step, said block ILU factorization step, said fill-in adding step, said line collection ILU factorization step, and said convergent solution judging step at the time point decided by said point deciding step until the time point reaches a predetermined final time; and a step of outputting a series of convergent solutions representing the operation of the electronic circuit over time.

6. A simulation method for simulating an operation of an electronic circuit, comprising the steps of:

a step of selecting a data processing means having the highest processing speed and the lowest convergence capacity, of a plurality of data processing means for executing a simulation of an electronic circuit operation, in various method different in processing speed and convergence capacity of a solution, by use of an implicit integration formula and a Newton iteration method, thereby performing a simulation;

a step of detecting iteration times by the Newton iteration method in the processing of said data processing means which performed the simulation; and a step of controlling said processing selecting step so as to sequentially switch said data processing means to that one having the higher processing speed and the lower convergence capacity next to said data processing means which performed the simulation, when the iteration times detected by said time-detecting step is beyond a predetermined allowed time;

wherein one of the processing by said plurality of data processing means further includes a step of receiving description data of an electronic circuit to be simulated, a step of partitioning the description data of the electronic circuit received from said data input step to generate description data of partial circuits, a step of deciding a time point of the next stage for the description data of the partial circuits generated by said data partitioning step, a step of generating a simultaneous linear equation by application of the implicit integration formula and the Newton iteration method to the description data of the partial circuits at the time point of the next stage as decided by said point deciding step, a step of performing incomplete LU factorization processing in parallel on each of several blocks in a bordered-block-diagonal coefficient matrix of the simultaneous linear equation generated by said equation generating step to produce a plurality of fill-ins, respectively, a step of respectively adding a fill-in generated by the corresponding ILU factorization means to a combined portion of coefficient matrices, in parallel, a step of respectively ILU-factorizing a corresponding one of several line collections on the combined portion, in parallel, a step of repeating a series of processing by said equation generating step, said block ILU factorization step, said fill-in adding step, and said line collection ILU factorization step until convergence of a solution in the simultaneous linear equation generated by said equation generating step is reached, a step of repeating a series of iteration processing by said equation generating step, said block ILU factorization step, said fill-in adding step, said line collection ILU factorization step, and said convergent solution judging step at the time point decided by said point deciding step until the time point reaches a predetermined final time, and a step of outputting a series of convergent solutions representing the operation of the electronic circuit over time.

7. A computer readable memory storing a control program for controlling a simulation device for simulating an operation of an electronic circuit, the control program comprising the steps of:

a step of receiving description data of an electronic circuit to be simulated;

a step of partitioning the description data of the electronic circuit received from said data input step to generate description data of partial circuits;

a step of deciding a time point of the next stage for the description data of the partial circuits generated by said data partitioning step;

a step of generating a simultaneous linear equation by application of an implicit integration formula and a Newton iteration method to the description data of the partial circuits at the time point of the next stage as decided by said point deciding step;

a step of performing incomplete LU factorization processing in parallel on each of several blocks in a bordered-block-diagonal coefficient matrix of the simultaneous linear equation generated by said equation generating step to produce a plurality of fill-ins, respectively;

a step of respectively adding a fill-in generated by the corresponding ILU factorization means to a combined portion of coefficient matrices, in parallel;

a step of respectively ILU-factorizing a corresponding one of several line collections on the combined portion, in parallel;

a step of repeating a series of processing by said equation generating step, said block ILU factorization step, said fill-in adding step, and said line collection ILU factorization step until convergence of a solution in the simultaneous linear equation generated by said equation generating step is reached;

a step of repeating a series of iteration processing by said equation generating step, said block ILU factorization step, said fill-in adding step, said line collection ILU factorization step, and said convergent solution judging step at the time point decided by said point deciding step until the time point reaches a predetermined final time; and a step of outputting a series of convergent solutions representing the operation of the electronic circuit over time.

8. A computer readable memory storing a control program for controlling a simulation device for simulating an operation of an electronic circuit, the control program comprising the steps of:

a step of selecting a data processing means having the highest processing speed and the lowest convergence capacity, of a plurality of data processing means for executing a simulation of an electronic circuit operation, in various methods different in processing speed and convergence capacity of a solution, by use of an implicit integration formula and a Newton iteration method, thereby performing a simulation;

a step of detecting iteration times by the Newton iteration method in the processing of said data processing means which performed the simulation; and a step of controlling said processing selecting step so as to sequentially switch said data processing means to that one having the higher processing speed and the lower convergence capacity next to said data processing means which performed the simulation, when the iteration times detected by said time-detecting step is beyond a predetermined allowed time;

wherein one of the processing by said plurality of data processing means further includes a step of receiving description data of an electronic circuit to be simulated, a step of partitioning the description data of the electronic circuit received from said data input step to generate description data of partial circuits, a step of deciding a time point of the next stage for the description data of the partial circuits generated by said data partitioning step, a step of generating a simultaneous linear equation by application of the implicit integration formula and the Newton iteration method to the description data of the partial circuits at the time point of the next stage as decided by said point deciding step, a step of performing incomplete LU factorization processing in parallel on each of several blocks in a bordered-block-diagonal coefficient matrix of the simultaneous linear equation generated by said equation generating step to produce a plurality of fill-ins, respectively, a step of respectively adding a fill-in generated by the corresponding ILU factorization means to a combined portion of coefficient matrices, in parallel, a step of respectively ILU-factorizing a corresponding one of several line collections on the combined portion, in parallel, a step of repeating a series of processing by said equation generating step, said block ILU factorization step, said fill-in adding step, and said line collection ILU factorization step until convergence of a solution in the simultaneous linear equation generated by said equation generating step is reached a step of repeating a series of iteration processing by said equation generating step, said block ILU factorization step, said fill-in adding step, said line collection ILU factorization step, and said convergent solution judging step at the time point decided by said point deciding step until the time point reaches a predetermined final time, and a step of outputting a series of convergent solutions representing the operation of the electronic circuit over time.

* * * * *